United States Patent
Hsieh et al.

(10) Patent No.: US 10,796,665 B1
(45) Date of Patent: Oct. 6, 2020

(54) CONTROL APPARATUS FOR DRIVING DISPLAY PANEL AND METHOD THEREOF

(71) Applicant: Novatek Microelectronics Corp., Hsinchu (TW)

(72) Inventors: Cheng-Tsu Hsieh, Taoyuan (TW); Shang-Heng Shih, Tainan (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/406,006

(22) Filed: May 7, 2019

(51) Int. Cl.
*G09G 3/36* (2006.01)
*H03F 3/45* (2006.01)
*G09G 5/10* (2006.01)

(52) U.S. Cl.
CPC ............... *G09G 5/10* (2013.01); *G09G 3/36* (2013.01); *G09G 2310/0254* (2013.01); *G09G 2310/0275* (2013.01); *G09G 2310/0291* (2013.01); *G09G 2310/08* (2013.01); *G09G 2320/0247* (2013.01); *G09G 2320/0673* (2013.01); *H03F 3/45183* (2013.01)

(58) Field of Classification Search
CPC .. H03F 3/211; H03F 3/30; H03F 2203/45091; H03F 3/45; H03F 3/45183; H03F 1/523; H03F 3/72; H03F 2203/45101; G09G 3/36; G09G 5/10; G09G 2310/0254; G09G 2310/0275; G09G 2310/0291; G09G 2310/0297; G09G 2310/08; G09G 2320/0247; G09G 2320/0673
See application file for complete search history.

(56) References Cited

U.S. PATENT DOCUMENTS

| | | | | |
|---|---|---|---|---|
| 6,480,178 B1* | 11/2002 | Itakura | ................. | G09G 3/3688 345/89 |
| 10,497,308 B1* | 12/2019 | Tseng | .................... | G11C 27/026 |
| 2002/0033786 A1* | 3/2002 | Akimoto | .............. | G09G 3/3688 345/87 |
| 2003/0164730 A1* | 9/2003 | Milanesi | ............. | H03F 3/45475 330/9 |
| 2004/0055963 A1* | 3/2004 | Toyozawa | ............. | H02M 3/073 210/744 |
| 2006/0113969 A1* | 6/2006 | Hatanaka | ......... | G01R 19/16571 323/212 |
| 2007/0012897 A1* | 1/2007 | Lee | .................... | G02F 1/133382 252/299.1 |
| 2007/0030262 A1* | 2/2007 | Ambo | .................. | H03G 1/0094 345/204 |

(Continued)

*Primary Examiner* — Michael J Eurice
(74) *Attorney, Agent, or Firm* — JCIPRNET

(57) ABSTRACT

A control apparatus for driving a display panel and a method thereof are provided. The control apparatus includes an image flickering detector and a chopper selector. The image flickering detector detects whether a present image pattern displayed on the display panel is flickering or not. The chopper selector selects a first chopper mode from a plurality of chopper modes for adjusting gamma voltages of a display image data, and detects whether the present image displayed on the display panel according to the display image data is flickering or not by the image flickering detector. The chopper selector selects a second chopper mode to adjust the gamma voltages of the display image data in response to the present image being flickering. The first chopper mode is different from the second chopper mode.

12 Claims, 18 Drawing Sheets

(56) References Cited

U.S. PATENT DOCUMENTS

| | | | |
|---|---|---|---|
| 2008/0150636 A1* | 6/2008 | Wu | H03F 3/45183 330/253 |
| 2008/0197834 A1* | 8/2008 | Takeda | H03F 1/26 324/123 R |
| 2009/0102780 A1* | 4/2009 | Brown | G09G 3/3648 345/101 |
| 2009/0273739 A1* | 11/2009 | Brown | G09G 3/3648 349/72 |
| 2011/0043216 A1* | 2/2011 | Huang | G01R 31/316 324/537 |
| 2011/0215726 A1* | 9/2011 | Liu | H05B 45/10 315/210 |
| 2012/0032944 A1* | 2/2012 | Kojima | H03F 3/45183 345/212 |
| 2012/0075022 A1* | 3/2012 | Lin | H03F 3/45183 330/253 |
| 2014/0009191 A1* | 1/2014 | Chen | H03F 3/45219 327/109 |
| 2014/0029143 A1* | 1/2014 | Lim | H03F 3/72 361/56 |
| 2016/0149574 A1* | 5/2016 | Cui | G09G 3/3696 327/513 |

\* cited by examiner

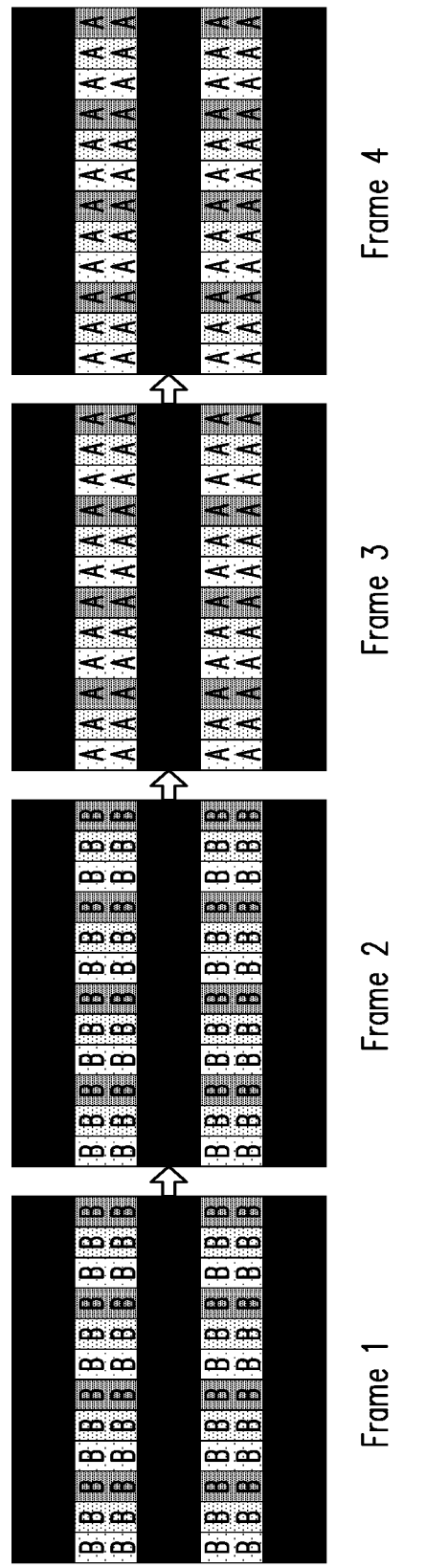

CONTROL APPARATUS FOR DRIVING DISPLAY PANEL AND METHOD THEREOF

BACKGROUND OF THE INVENTION

Field of the Invention

The disclosure relates to a control technology for testing a display panel, and particularly relates to a control apparatus for driving a display panel to avoid flickering on the display panel by changing chopper algorithms and a method thereof.

Description of Related Art

Built-in gamma operational amplifier of the source driver circuit in a display panel can greatly reduce the number of lines in the gamma voltage layout on a display panel, makes the design of the control circuit board in the display panel easier. But, an offset difference in a input stage differential pair of the gamma operational amplifier will affect an offset difference between two nodes of the input stage differential pair. Therefore, the gamma operational amplifier uses a chopper algorithm to compensate the offset difference between the two nodes of the input stage differential pair. In other words, the chopper algorithm is driven by using brightness of the corresponding display units for smoothing the offset difference of the input stage differential pair.

However, the display panel may be tested by driving in one of two adjacent display unit rows and disabling the another of the two adjacent display unit rows, thus the image displayed on the display panel may be flickering because of some types of the driven chopper algorithms in some cases. It is a question how to avoid the image displayed on the display panel flickering caused by the driven chopper algorithm while the display panel is tested.

SUMMARY OF THE INVENTION

The disclosure provides a control apparatus for driving a display panel and the method thereof to effectively avoid the image pattern displayed on the display panel flickering by automatically selecting appropriate chopper algorithm while testing the display panel.

A control apparatus for driving a display panel according to an embodiment of the disclosure includes an image flickering detector and a chopper selector. The image flickering detector detects whether a present image displayed on the display panel is flickering or not. The chopper selector is coupled to the image flickering detector. The chopper selector selects a first chopper mode from a plurality of chopper modes for adjusting gamma voltages of a display image data, and the image flickering detector detects whether the present image displayed on the display panel according to the display image data is flickering or not, and the chopper selector selects a second chopper mode from the plurality of chopper modes to adjust the gamma voltages of the display image data in response to the present image on the display panel flickering. The first chopper mode is different from the second chopper mode.

A method for driving a display panel according to an embodiment of the disclosure includes: selecting, by a chopper selector, a first chopper mode from a plurality of chopper modes for adjusting gamma voltages of a display image data; detecting, by an image flickering detector, whether a present image on the display panel is flickering or not; and, selecting, by the chopper selector, a second chopper mode from the plurality of chopper modes to adjust the gamma voltages of the display image data in response to the present image on the display panel flickering, wherein the first chopper mode is different from the second chopper mode.

Based on the above, the control apparatus in the embodiments of the disclosure are capable of automatically selecting/changing appropriate chopper algorithm (i.e., changing one of a plurality of chopper algorithms sequentially) for effectively avoiding the image pattern displayed on the display panel flickering. In other words, the control apparatus detects whether a present image displayed on the display panel is flickering or not by the image flickering detector, and the chopper selector of the control apparatus selects or changes an appropriate chopper algorithm (i.e., chopper mode) from the plurality of chopper algorithms (i.e., chopper modes) to adjust the gamma voltages of the display image data (i.e., test image data) in response to the present image on the display panel flickering until the present image on the display panel is not flickering. Thus, the control apparatus of the display panel avoids present image on the display panel flickering because of the driven chopper algorithm of the display panel while testing the display panel.

To make the aforementioned more comprehensible, several embodiments accompanied with drawings are described in detail as follows.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

FIG. 7 illustrates a schematic view of chopper mode "1-line, 2-frame" using the column inversion method for driving the display panel according to an embodiment of the disclosure.

FIG. 9 illustrates a schematic view of chopper mode "2-line, 2-frame" using the dot inversion method for driving the display panel according to an embodiment of the disclosure.

FIGS. 12A-12C illustrate another example how to avoid the image pattern displayed on the display panel flickering by automatically selecting appropriate chopper algorithm while testing the display panel according to embodiments of the disclosure.

DESCRIPTION OF THE EMBODIMENTS

Figure 1:
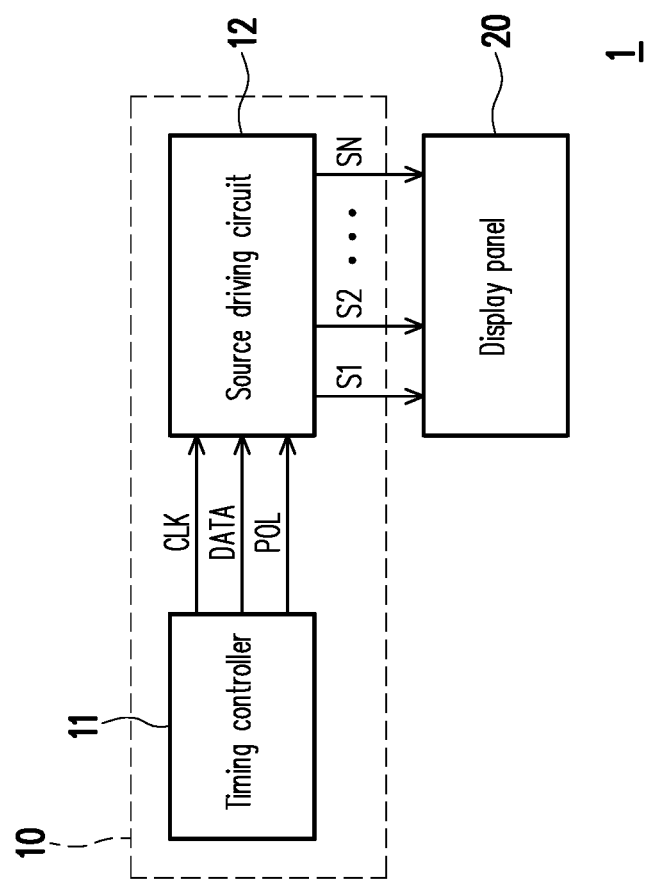
FIG. 1 is a schematic view illustrating an electronic device with a display panel according to an embodiment of the disclosure.

FIG. 1 is a schematic view illustrating an electronic device with a display panel according to an embodiment of the disclosure. Referring to FIG. 1, the electronic device 1 includes a control apparatus 10 and a display panel 20. The electronic device 1 may be a display device (i.e., a television, a display . . . etc.), a smart phone, a laptop computer, or other customer electronic device with display function. The control apparatus 10 is configured to control the display panel 20. The control apparatus 10 is also referred as a panel control device. The control apparatus 10 includes a timing controller 11 and a source driving circuit 12. The timing controller 11 may transmit test image data (DATA), a clock signal (CLK) and polarity data (POL) to a source driving circuit 12 to form a display image data S1-SN. The display panel 20 receives the display image data S1-SN to display a display image corresponding to the display image data under the control of the control apparatus 10.

The source driving circuit 12 of the embodiment has a plurality of gamma operational amplifiers for implementing a driving chopper algorithm to reduce the output voltage offset of the output node in the gamma operational amplifier. Each of the gamma operational amplifier has two input nodes as the input stage differential pair, and the offset difference in an input stage differential pair means the voltage difference between the two input nodes caused by the semiconductor process or circuit layout. The chopper algorithm is used to reduce a difference of the output voltage of the gamma operational amplifier and the ideal output voltage in design by switching the polarities of the input stage differential pair in every fixed number of lines (may be row lines or column lines) at one frame and switching the polarities of the input stage differential pair in every fixed number of frames in the display image.

In the embodiment, a chopper mode also refers as the chopper algorithm, and it has a plurality of chopper modes, such as "1-line, 2-frame", "2-line, 2-frame", and "2-line, 1-frame". Take the chopper mode "1-line, 2-frame" as an example, the control apparatus 10 switches polarities of the input stage differential pair in each row line at one frame and in every two frames in the display image. If the display panel 20 is tested for its function, it may disable the odd rows of the display units on the display panel 20, and only use the even rows of the display units to display the display image. While the chopper algorithm is driven by switching the polarities of the input stage differential pair in each row line, the display image on the display panel 20 may be flickering for every two frames while one frame only has positive polarities of the input stage differential pair in the gamma operational amplifier and another adjacent frame only has negative polarities of the input stage differential pair in the gamma operational amplifier.

For avoiding the image pattern displayed on the display panel flickering, the embodiment of the disclosure automatically selects an appropriate chopper algorithm of the chopper algorithms (hereafter called as chopper modes) while testing the display panel 20 until the image pattern not flickering.

Figure 2:
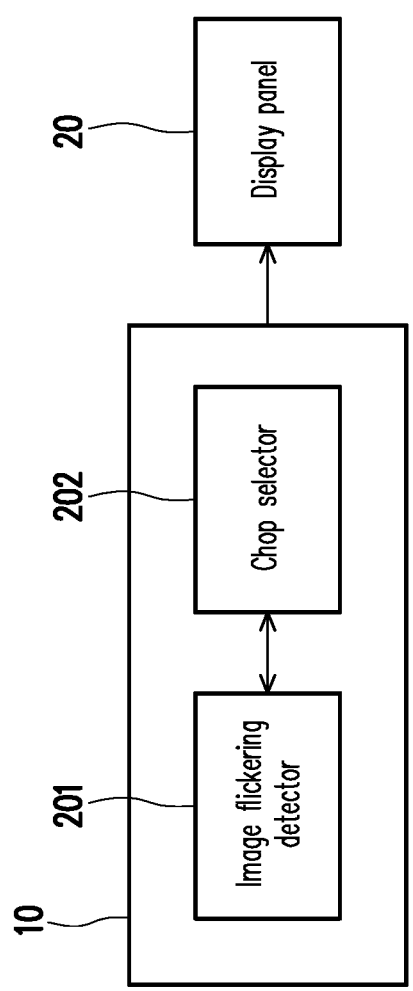
FIG. 2 illustrates a schematic view of the control apparatus 10 in the electronic device according to an embodiment of the disclosure.

FIG. 2 illustrates a schematic view of the control apparatus 10 in the electronic device according to an embodiment of the disclosure. Referring to FIG. 2, the control apparatus 10 includes an image flickering detector 201 and a chopper selector 202. The image flickering detector 201 detects whether the present image displayed on the display panel is flickering or not. The chopper selector 202 is coupled to the image flickering detector 201. In detail, while the electronic device 1 is booted, started up or enabled, the chopper selector 202 selects one chopper mode from a plurality of chopper mode to adjust gamma voltages of the test image data. And, the timing controller 11 and the source driving circuit 12 in FIG. 1 generate the display image data (i.e., test image data) according to the selected chopper mode (i.e., a first chopper mode) for adjusting gamma voltages of a test image data, then the display panel 20 displays a present image according to the test image data. The image flickering detector 201 uses the image pattern detection technology to detect whether the present image is flickering or not, that is, the image flickering detector 201 temporarily store entire or part of two adjacent frames in the present image displayed on the display panel to identify whether the two adjacent frames are flickering or not. The image flickering detector 201 may implemented in the timing controller 11, the source driving circuit 12, or an integrated circuit with the timing controller 11 and the source driving circuit 12 in FIG. 1. While the present image displayed on the display panel is changed, the image flickering detector 201 automatically detects whether the present image displayed on the display panel is flickering or not.

While the image flickering detector 201 detects that the present image is flickering, in other words, while the image flickering pattern detector 201 detects that the first chopper mode makes the present image on the display panel flickering, the chopper selector 202 selects a second chopper mode from the plurality of chopper modes to adjust the gamma voltages of the display image data in response to the present image flickering. In other words, the chopper selector 202 changes the present selected chopper mode (i.e., the first chopper mode) to another chopper mode (i.e., the second chopper mode). The timing controller 11 and the source driving circuit 12 in FIG. 1 generate the display image data according to the selected chopper mode (i.e., the second chopper mode) for adjusting the gamma voltages of the display image data, then the display panel 20 displays the present image according to the updated display image data. If the present image still flickering detected by the image flickering detector 201, the until the image flickering detector 201 detects that the present image is not flickering chopper selector 202 selects another chopper mode and repeat the operations. In the embodiment, the chopper selector 202 may select one of the pluralities of the chopper modes sequentially until the image flickering detector 201 detects that the present image is not flickering.

In the embodiment of the disclosure, the chopper selector 202 comprises an buffer configured to temporarily store a selected chopper mode from the plurality of chopper modes. The chopper selector 202 temporarily stores the selected chopper mode, and the selected chopper mode is used to adjust the gamma voltages of the display image data. The buffer can be implemented as a hard drive, RAM, ROM, flash memory, or any other types of memory devices.

Figure 3:
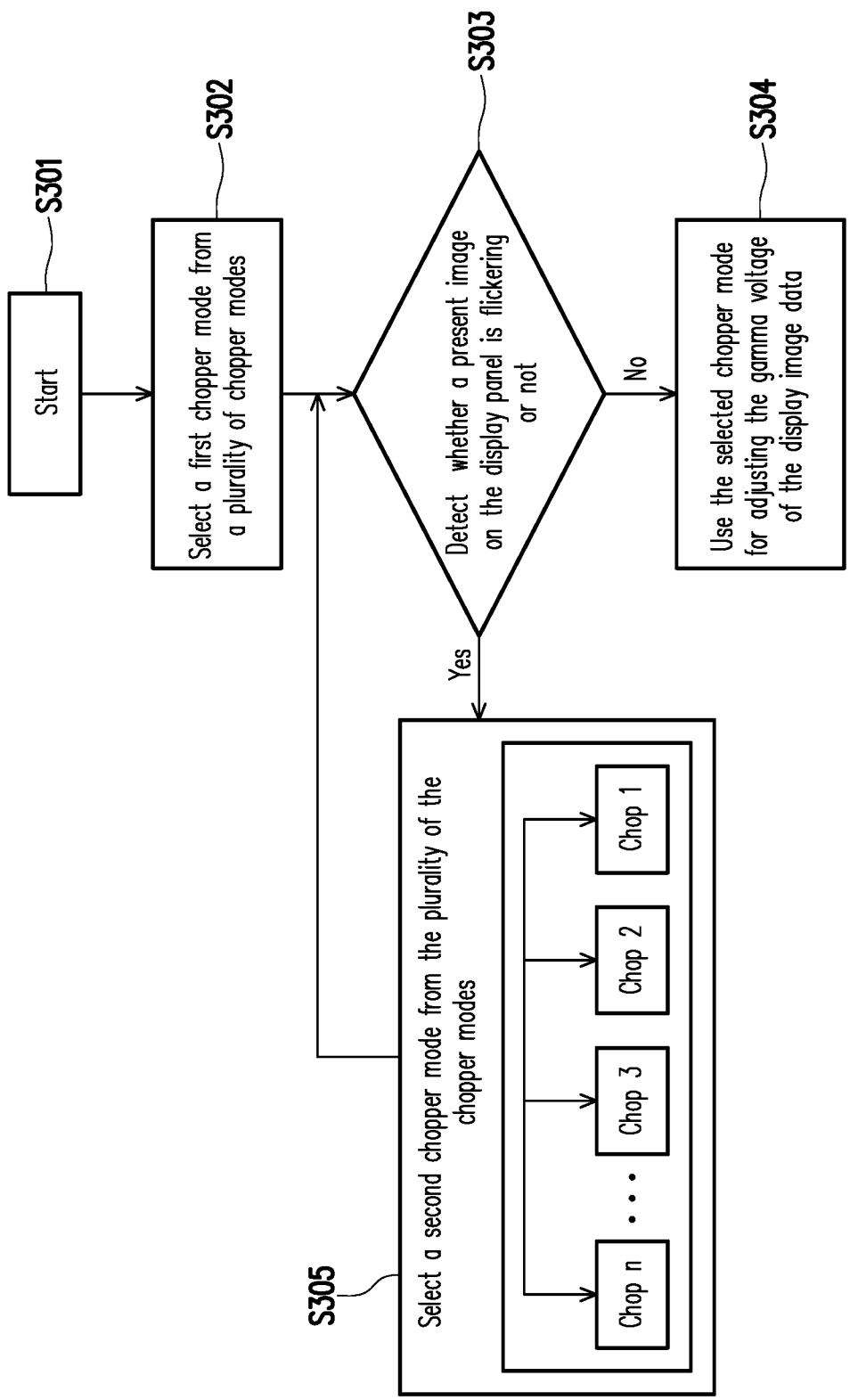
FIG. 3 is a flowchart illustrating a method for driving a display panel according to an embodiment of the disclosure.

FIG. 3 is a flowchart illustrating a method for driving a display panel according to an embodiment of the disclosure. Referring to FIG. 2 and FIG. 3, at step S301, the electronic device 1 is booted, started up or enabled and the control apparatus 10 is started. At step S302, the chopper selector 202 of the control apparatus 10 selects the first chopper mode from the plurality of chopper modes for adjusting gamma voltages of the display image data. In detail, the source driving circuit 12 in FIG. 1 fetches the previously selected chopper mode from the buffer of the chop selector 202 for adjusting the gamma voltage of the display image data. And, the display panel 20 displays the present image according to the display image data. At step S303, the image flickering detector 201 of the control apparatus 10 detects whether the present image on the display panel is flickering or not in previously selected chopper mode. If the present image on the display panel is not flickering (i.e., the step S304 is "No"), at the step S304 form the S303, the source driving circuit 12 in FIG. 1 still uses the selected chopper mode for adjusting the gamma voltage of the display image data, and the display panel 20 displays the present image according to the display image data. On the other hand, if the present image on the display panel is flickering (i.e., the step S304 is "Yes"), at the step S305 form the S303, the chop selector 202 selects a second chopper mode from the plurality of the chopper modes to adjust the gamma voltages of the display image data by the source driving circuit 12 in FIG. 1 in response to the present image on the display panel flickering. The first chopper mode is different from the second chopper mode. In detail, the chop selector 202 has the plurality of chopper modes Chop 1-Chop n, and the chopper selector 202 selects one of the pluralities of the chopper modes Chop 1-Chop n sequentially as the second chopper mode while executing step S305 each time, until the image flickering detector 201 detects that the present image is not flickering (i.e., until the step S304 is "No").

Figure 4:
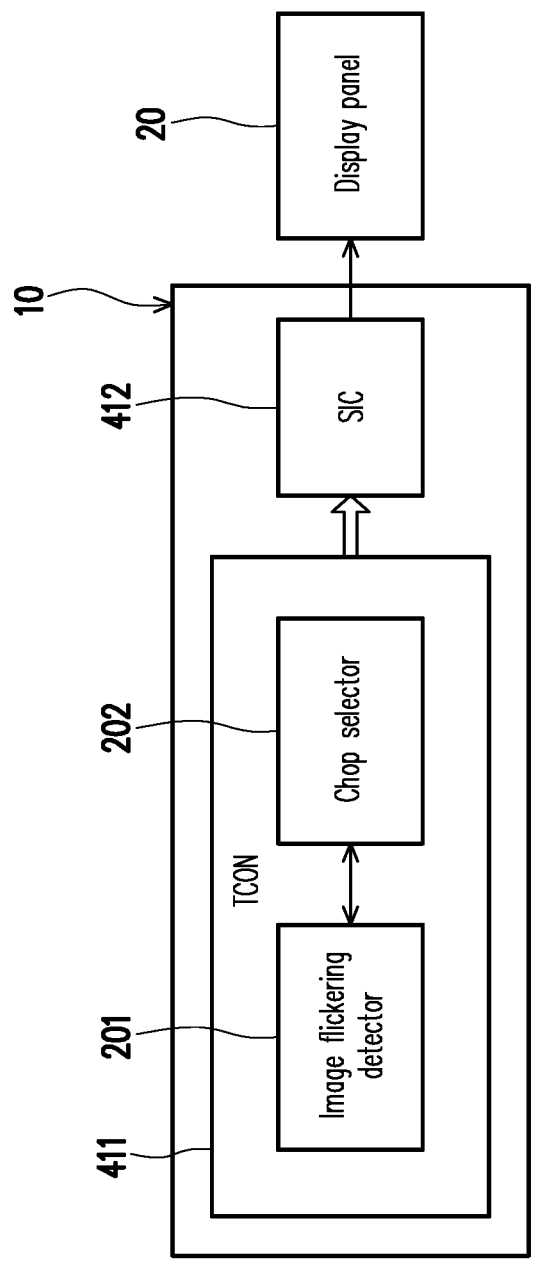
FIG. 4 and FIG. 5 illustrate schematic views of the control apparatus 10 in the electronic device according to two embodiments of the disclosure.
Figure 5:
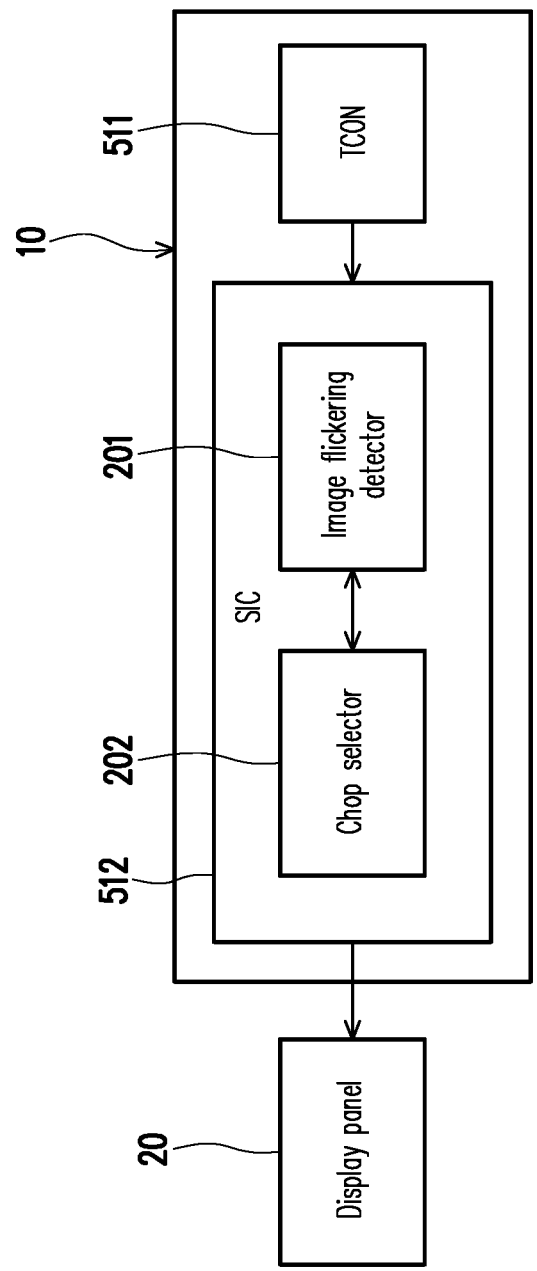

FIG. 4 and FIG. 5 illustrate schematic views of the control apparatus 10 in the electronic device according to two embodiments of the disclosure. As shown in FIG. 4, the control apparatus 10 includes a source driving circuit (SIC) 412, which is configured to control the gamma voltage of the test image data, and a timing controller (TCON) 411. The timing controller 411 further includes the image flickering detector 201 and the chopper selector 202 in FIG. 4 of the embodiment. In other words, the image flickering detector 202 and the chopper selector 202 are included in the timing controller 411. As shown in FIG. 5, the control apparatus 10 includes a source driving circuit (SIC) 512 and a timing controller (TCON) 511. The source driving circuit (SIC) 512 further includes the image flickering detector 201 and the chopper selector 202 in FIG. 5 of the embodiment. In other words, the image flickering detector 201 and the chopper selector 202 are included in the source driving circuit 512.

Figure 6A:
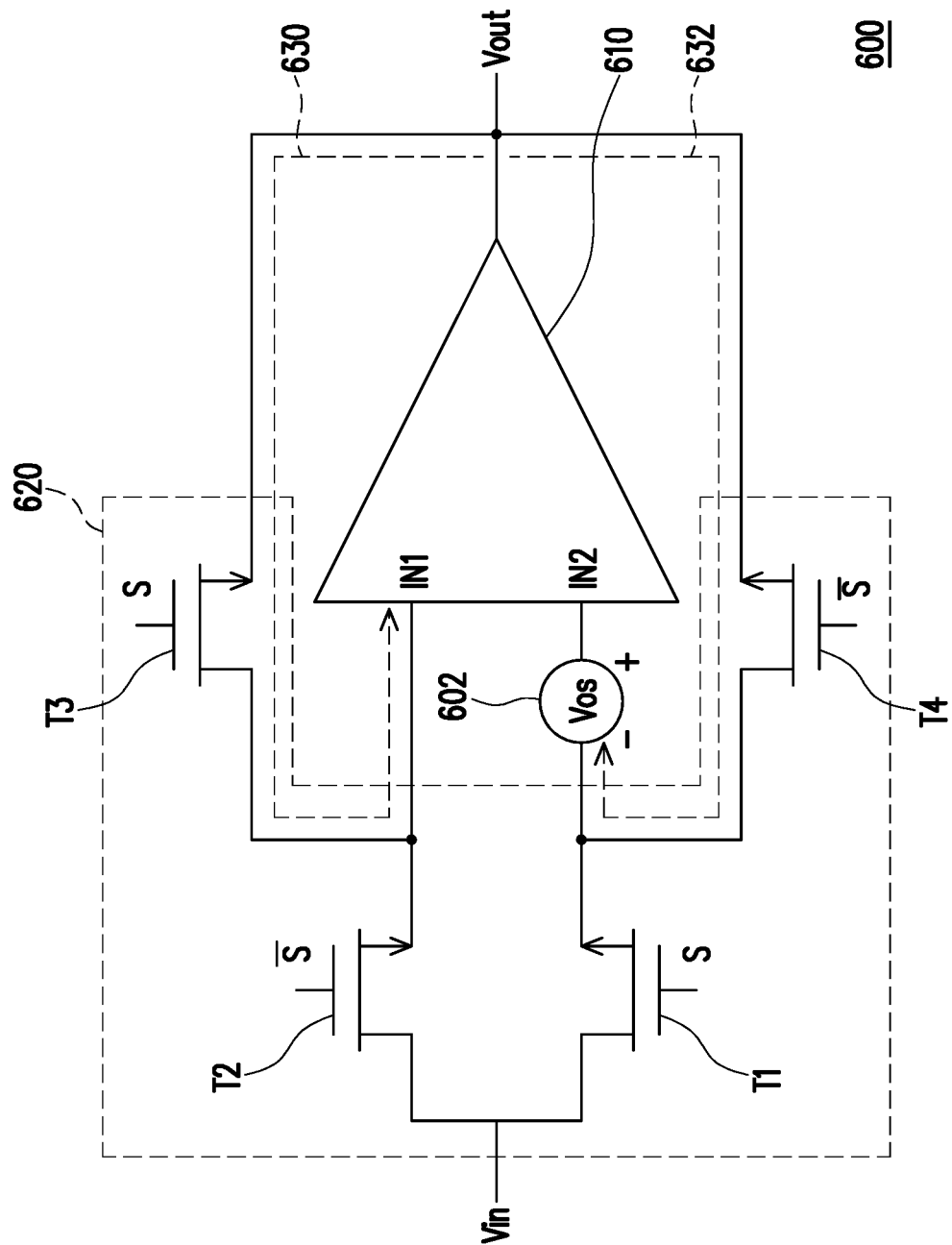
FIG. 6A illustrates a schematic view of a gamma operational amplifier and a chopper control circuit of the source driving circuit according to the above embodiments of the disclosure.

FIG. 6A illustrates a schematic view of a gamma operational amplifier and a chopper control circuit of the source driving circuit according to the above embodiments of the disclosure. The source driving circuit 12 in FIG. 1, the source driving circuit (SIC) 412 in FIG. 4 and the source driving circuit (SIC) 512 in FIG. 5 have a plurality of gamma adjusting circuits, and the gamma adjusting circuit 600 is taken as an example in FIG. 6A for implementing the embodiments of the disclosure. The gamma adjusting circuit 600 includes the gamma operational amplifier 610 and the chopper control circuit 620. The gamma operational amplifier 610 is served as an output buffer of the source driving circuit 12/412/512. The chopper control circuit 620 is coupled to the gamma operational amplifier 610. The chopper control circuit 620 is controlled by the selected chopper mode in the chopper selector 202 for reducing an output voltage offset of an output node VOUT in the gamma operational amplifier 610.

In detail, the chopper control circuit 620 is configured to switch the polarities of the input stage differential pair (i.e., the input nodes IN1 and IN2) of the gamma operational amplifier 610 to reduce an offset difference Vos by the offset source 602, thus the output voltage offset of the output node Vout are also reduced. The chopper control circuit 620 includes a plurality of transistors, such as a first transistor T1, a second transistor T2, a third transistor T3 and a fourth transistor T4. A first terminal of the first transistor T1 is coupled to an input voltage terminal Vin of the chopper control circuit 620, a second terminal of the first transistor T1 is coupled to a second input node IN2 of the gamma operational amplifier 610 through the offset source 602 and a gate terminal of the first transistor T1 is coupled to a control signal S according to the selected chopper mode. A first terminal of the second transistor T2 is coupled to the input voltage terminal Vin of the chopper control circuit 620, a second terminal of the second transistor T2 is coupled to the first input node IN1 of the gamma operational amplifier 610, and a gate terminal of the second transistor T2 is coupled to the inverted control signal $\overline{S}$ according to the selected chopper mode. A first terminal of the third transistor T3 is coupled to the output node Vout of the gamma operational amplifier 610, a second terminal of the third transistor T3 is coupled to the first input node IN1 and a gate terminal of the third transistor T3 is coupled to the control signal S. A first terminal of the fourth transistor T4 is coupled to the output node Vout of the gamma operational amplifier 610, a second terminal of the fourth transistor T4 is coupled to the second input node IN2 of the gamma operational amplifier 610 through the offset source 602, and a gate terminal of the fourth transistor T4 is coupled to the inverted control signal $\overline{S}$. The paths 630 and 632 illustrate the two paths connecting the gamma operational amplifier input nodes IN1 and IN2 to the output stage Vout of the gamma operational amplifier 610. The transistors T1 and T3 are enabled when the control signal S is enabled (the inverted control signal $\overline{S}$ is disabled), and the transistors T2 and T4 are disabled at the same time. And, the transistors T1 and T3 are disabled when the control signal S is disabled (the inverted control signal $\overline{S}$ is enabled), and the transistors T2 and T4 are enabled at the same time. The chopper control circuit technique is to switch the polarities of the input stage differential pair to reduce the offset difference Vos affected by the offset source 602 shown in FIGS. 6B and 6C.

Figure 6B:
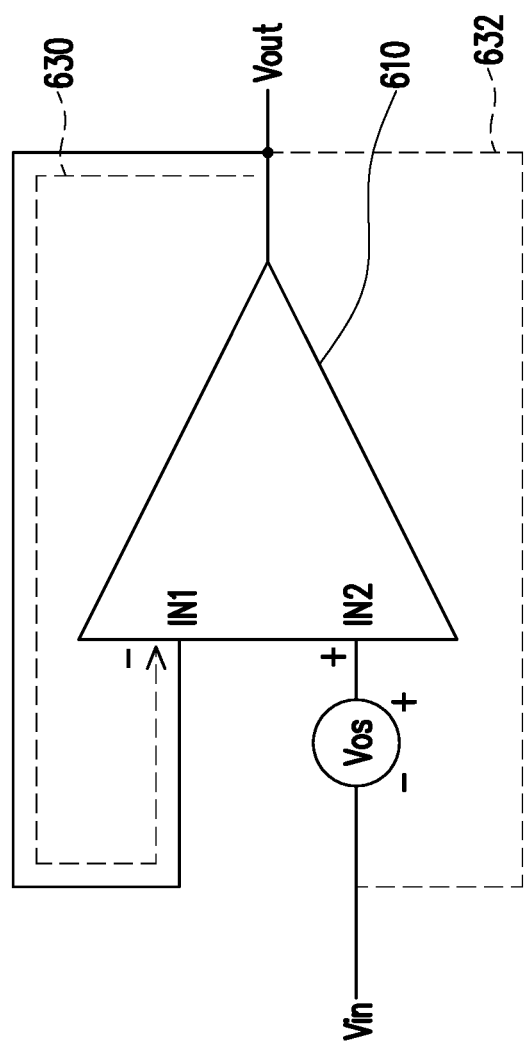
FIGS. 6B and 6C illustrate schematic views of the gamma operational amplifier with two paths for switching the polarities of the input stage differential pair according to the embodiment in FIG. 6A of the disclosure.
Figure 6C:
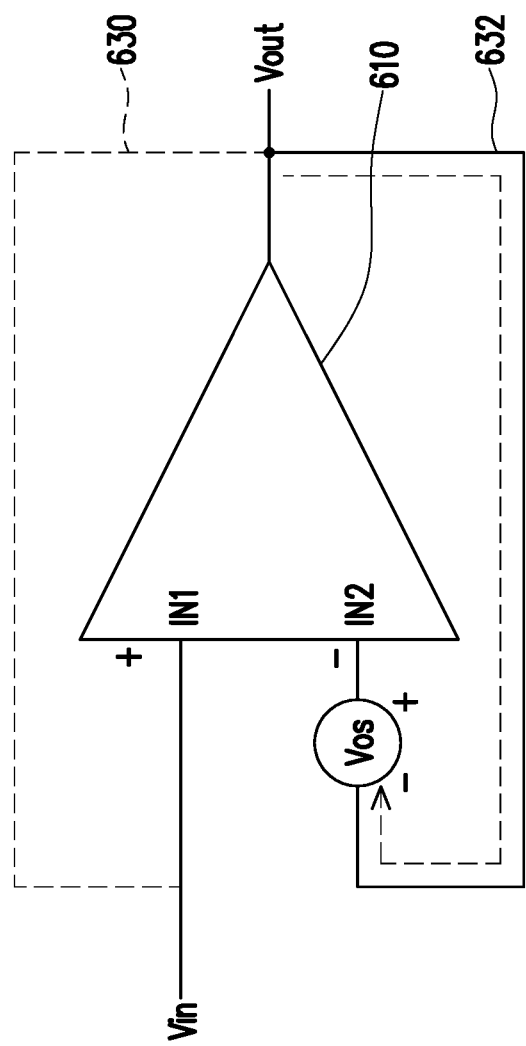

FIGS. 6B and 6C illustrate schematic views of the gamma operational amplifier 610 with two paths 630 and 632 for switching the polarities of the input stage differential pair according to the embodiment in FIG. 6A of the disclosure. While the selected chopper mode controls the gamma operational amplifier 610 with the positive polarities of the input stage differential pair, referring to the FIG. 6B, the second transistor T2 and the fourth transistor T4 may be disabled for disconnecting the path 632 and the first transistor T1 and third transistor T3 may be enabled for connecting the path 630. At this time, the input node IN1 of the gamma operational amplifier 610 is connected to the output node VOUT, and the input node IN2 of the gamma operational amplifier 610 is connected to the input voltage terminal Vin through the offset source 602. That is, the value of the output voltage on the output node VOUT is the value of the input voltage on the input voltage terminal Vin plus the value of the offset difference Vos. While the selected chopper mode controls the gamma operational amplifier 610 with the negative polarities of the input stage differential pair, referring to the FIG. 6C, the first transistor T1 and the third transistor T3 may be enabled for connecting the path 632 and the second transistor T2 and the fourth transistor T4 may be disabled for disconnecting the path 630. At this time, the input node IN1 of the gamma operational amplifier 610 is connected to the input voltage terminal Vin, and the input node IN2 of the gamma operational amplifier 610 is connected to the output node VOUT through the offset source 602. That is, the value of the output voltage on the output node VOUT is the value of the input voltage on the input voltage terminal Vin minus the value of the offset difference Vos. Therefore, in one complete clock cycle of the control signal S and the inverted control signal S, the average brightness of the adjacent pixel units may be the value of the input voltage on the input voltage terminal Vin.

Figure 10:
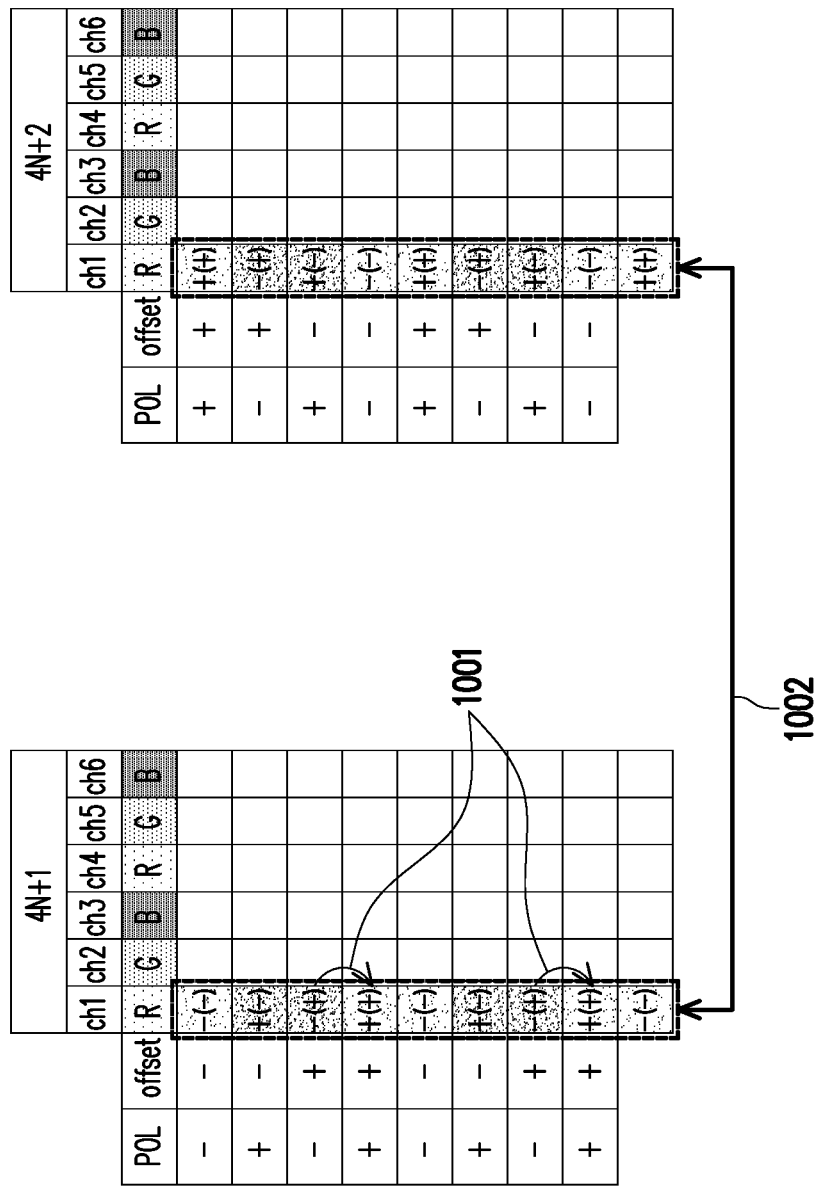
FIG. 10 illustrates a schematic view of chopper mode "2-line, 1-frame" using the dot inversion method for driving the display panel according to an embodiment of the disclosure.

The chopper control circuit 620 in FIG. 6A controls the gamma operational amplifier 610 for adjusting the gamma pixel value of the pixel units on the display panel 20. The display panel 20 may be driven by different way of the inversion methods, such as a column inversion method, a two-line inversion method, a dot inversion method . . . and so on. The chopper mode may be changed according to the different ways for the inversion methods. For example, the chopper mode and the related inversion method for driving the display panel 20 may implemented as the following embodiments, such as the chopper mode "1-line, 2-frame" using the column inversion method as shown in FIG. 7, the chopper mode "1-line, 2-frame" using the two-line inversion method as shown in FIG. 8, the chopper mode "2-line, 2-frame" using the dot inversion method as shown in FIG. 9, the chopper mode "2-line, 1-frame" using the dot inversion method as shown in FIG. 10, and those applying the embodiment are not particularly limited in terms of how to combine the chopper mode and the inversion method.

Figure 7:
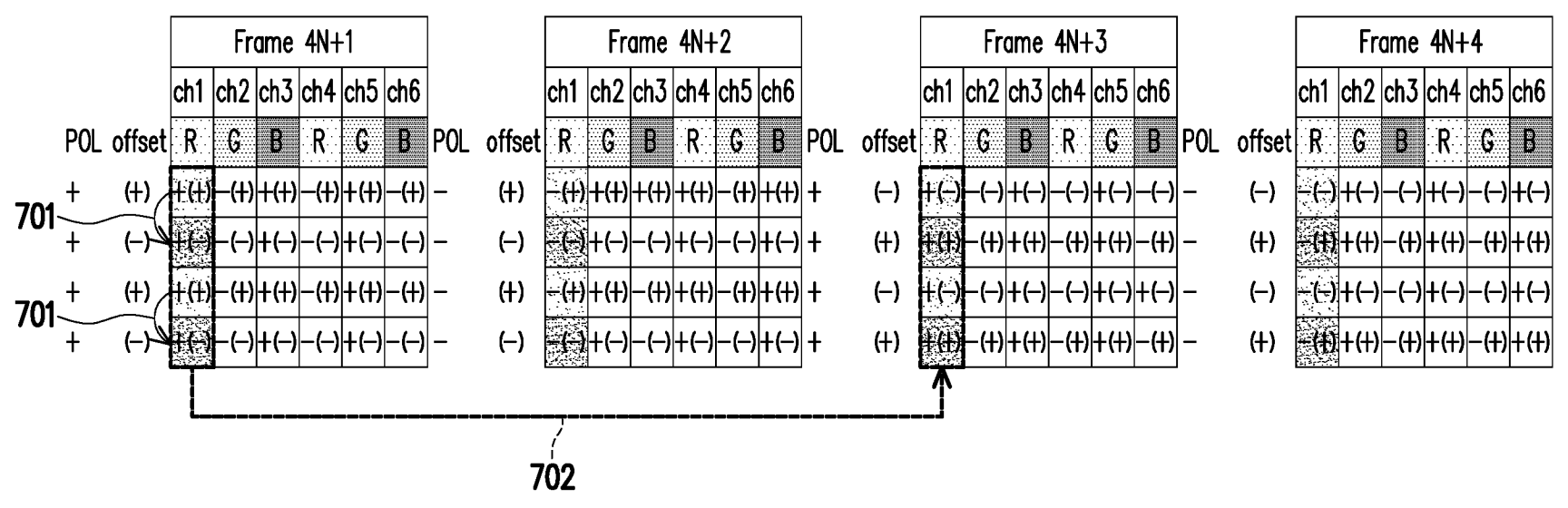

FIG. 7 illustrates a schematic view of chopper mode "1-line, 2-frame" using the column inversion method for driving the display panel according to an embodiment of the disclosure. FIG. 7 shows four frames Frame 4N+1, Frame 4N+2, Frame 4N+3, and Frame 4N+4. Each frame 4N+1 to 4N+4 consists of six channels ch1, ch2 ch3, ch4 ch5, ch3 with red R, green G, blue B, red R, green G, and blue B in vertical lines respectively. The pixel unit in each column has the same polarity with inverted polarity in the adjacent column. The column inversion method is applied in horizontal lines with offset difference of input differential pair very less, such that pixel units in each column with alternate offset polarities +,−,+,− . . . in each frame, as shown in FIG. 7. The cancellation of the offset difference in the gamma operational amplifier is performed by switching polarities by one line (shown by arrow 701) and switching polarities by two frames (shown by arrow 702) as shown in FIG. 7.

Figure 8:
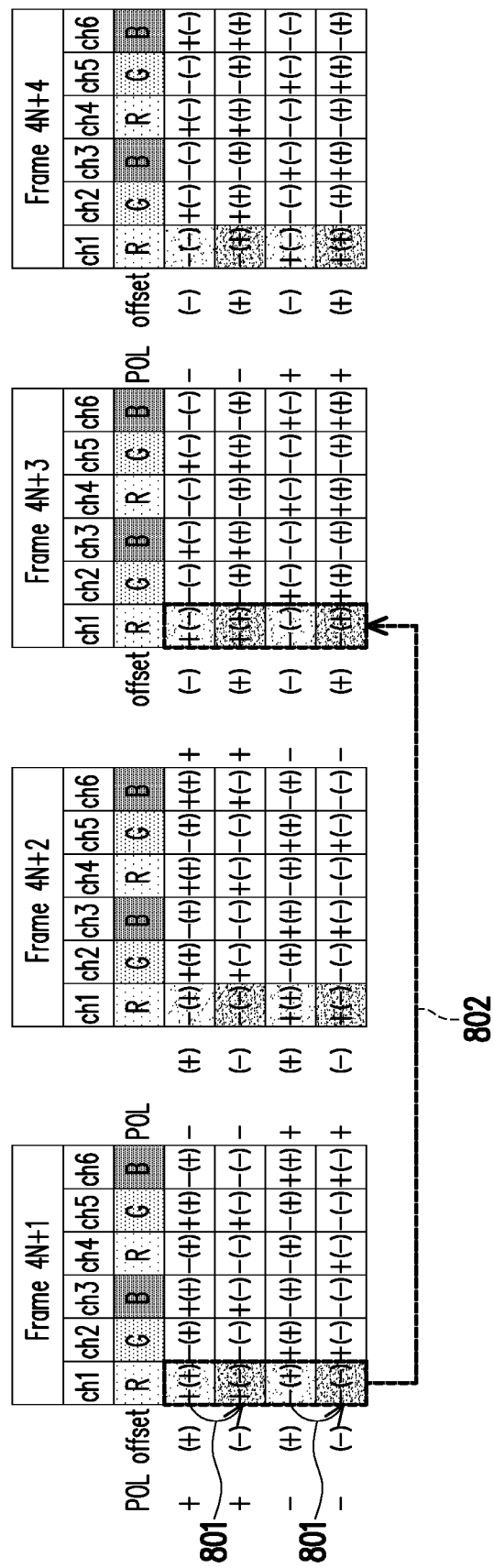
FIG. 8 illustrates a schematic view of chopper mode "1-line, 2-frame" using the two-line inversion method for driving the display panel according to an embodiment of the disclosure.

FIG. 8 illustrates a schematic view of chopper mode "1-line, 2-frame" using the two-line inversion method for driving the display panel according to an embodiment of the disclosure. FIG. 8 also shows four frames Frame 4N+1 to Frame 4N+4 as FIG. 7. In each frame, the pixel units in each column have two-line with the same polarity and next following two-line in the same column have a contrary polarity with inverted polarity in the adjacent column. The two-line inversion method is applied in horizontal lines such that pixel units in each column having alternate offset polarities+,−,+,− . . . in each frame as shown in FIG. 8. The cancellation of the offset difference in the gamma operational amplifier is performed by switching polarities by one line (shown by arrow 801) and switching polarities by two frames (shown by arrow 802) as shown in FIG. 8.

Figure 9:
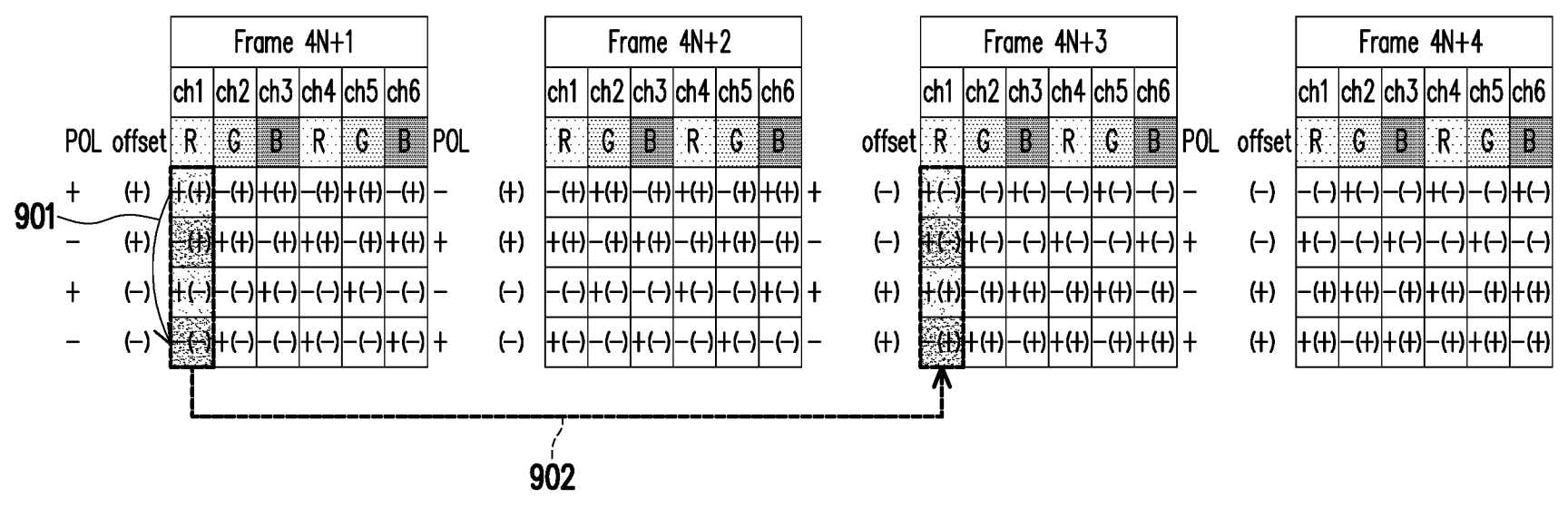

FIG. 9 illustrates a schematic view of chopper mode "2-line, 2-frame" using the dot inversion method for driving the display panel according to an embodiment of the disclosure. FIG. 9 also shows four frames Frame 4N+1 to Frame 4N+4 as FIGS. 7 and 8. In each frame, adjacent pixel units of each pixel unit contain contrary polarities. The dot inversion method is applied in vertical or horizontal lines with offset difference of each input differential pair, such that pixel unit in each column with alternate offset polarities+,+,−,−,+,+, . . . in each frame as shown in FIG. 9. The cancellation of the offset difference in the gamma operational amplifier is performed by switching polarities by two lines (shown by arrow 901) and switching polarities by two frames (shown by arrow 902) as shown in FIG. 9.

FIG. 10 illustrates a schematic view of chopper mode "2-line, 1-frame" using the dot inversion method for driving the display panel according to an embodiment of the disclosure. FIG. 10 shows two frames Frame 4N+1 and Frame 4N+2 as FIGS. 7-9. In each frame, adjacent pixel units of each pixel unit contain contrary polarities. The dot inversion method is applied in each column with alternate offset polarities +,+,−,− . . . in each frame as shown in FIG. 10. The cancellation of the offset difference in the gamma operational amplifier is performed by switching polarities by two lines (shown by arrow 1001), and performed by switching polarities by one frame (shown by arrow 1002) as shown in FIG. 10.

Figure 11A:
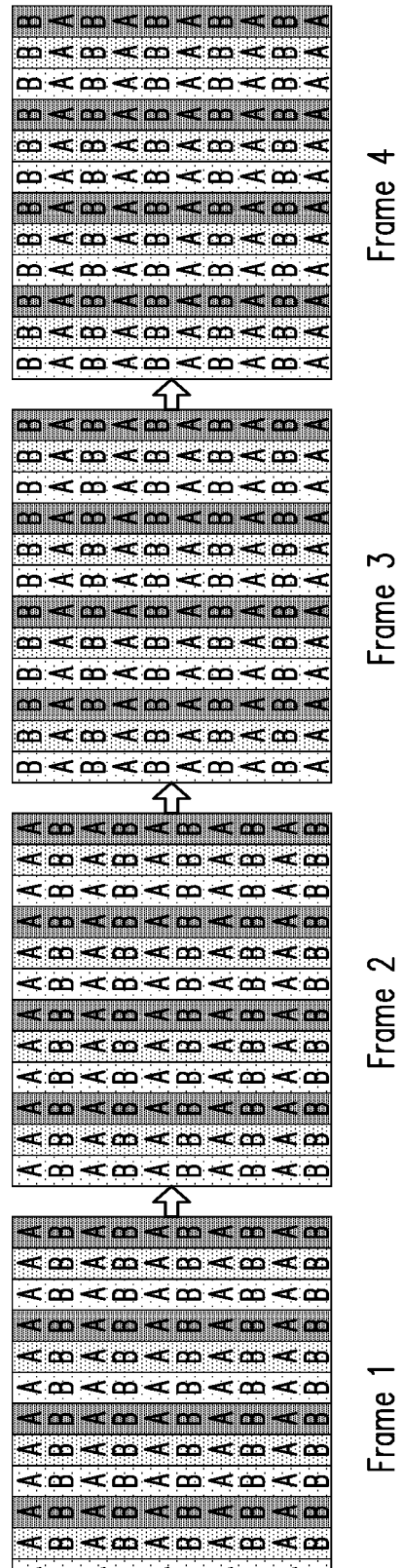
FIGS. 11A-11C illustrate one example how to avoid the image pattern displayed on the display panel flickering by automatically selecting appropriate chopper algorithm while testing the display panel according to embodiments of the disclosure.
Figure 11B:
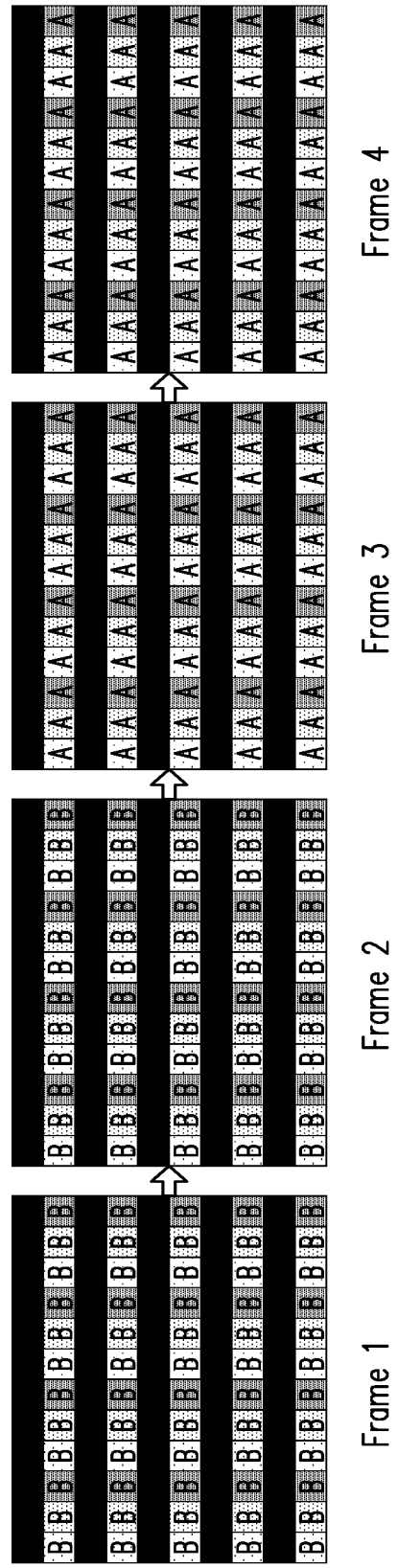
Figure 11C:
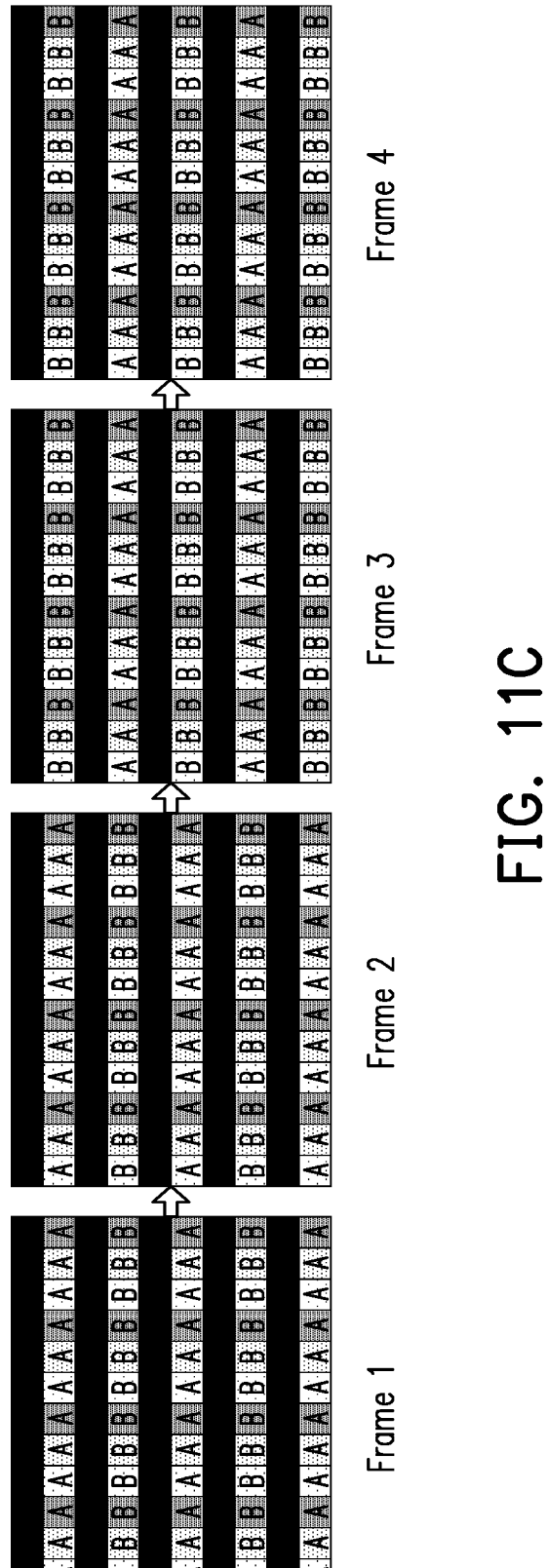

FIGS. 11A-11C illustrate one example how to avoid the image pattern displayed on the display panel flickering by automatically selecting appropriate chopper algorithm while testing the display panel according to embodiments of the disclosure. At first, the display units on the display panel are driven by using the chopper mode "1-line, 2-frame" (shown in FIG. 11A) and the flickering of the present image on the display panel occurs. FIG. 11A shows four frames where first two frames with a similar pattern and other two consecutive frames with opposite patterns. That is, one horizontal line in each frame is with pattern A and next horizontal line with the pattern B, so that the order "ABAB . . . " in each column of the frames are formed, and the other two frames contrary with the first two frames as shown in FIG. 11A.

While the display panel is tested by the image pattern with the H-stripe format, odd rows of the display units may be disabled and only even rows of the display units are used to display the image pattern shown in FIG. 11B. The display panel displays image pattern with the H-stripe format, due to the offset difference in the gamma operational amplifier input stage, the pixel units in the Frame 1 and Frame 2 only have one pattern (i.e., pattern B) of the polarities of the input stage differential pair in the gamma operational amplifier, and pixel units in the Frame 3 and Frame 4 only have another pattern (i.e., pattern A) of the polarities of the input stage differential pair in the gamma operational amplifier. That is, image pattern with the H-stripe format results in two frames display only pattern B and other two frames display only the pattern A. If patterns A and B are imbalanced in each frame, that frames appear at flashing rate ½ (i.e., 60 Hz) of the 120 Hz to cause present image flickering.

After changing the driven chopper mode from the chopper mode "1-line, 2-frame" to the chopper mode "2-line, 2-frame", the image pattern displayed on the display panel is not flickering. FIG. 11C illustrates a schematic view of the display panel with a chopper mode "2-line, 2-frame" when the display panel displays the image pattern with the H-stripe format. The image flickering detector detects that the present image is flickering in the chopper mode "1-line, 2-frame", them the chop selector changes from the chopper mode "1-line, 2-frame" to the chopper mode "2-line, 2-frame". As shown in FIG. 11C, the chopper selector set the chopper mode "2-line, 2-frame", so that the image pattern on the display panel can be arranged through a spatial arrangement of the pixel units to show both the patterns A and B in each frame as shown in the FIG. 11C, so as to average brightness of the adjacent pixel units and to avoid the image displaying on the display panel flickering.

Figure 12A:
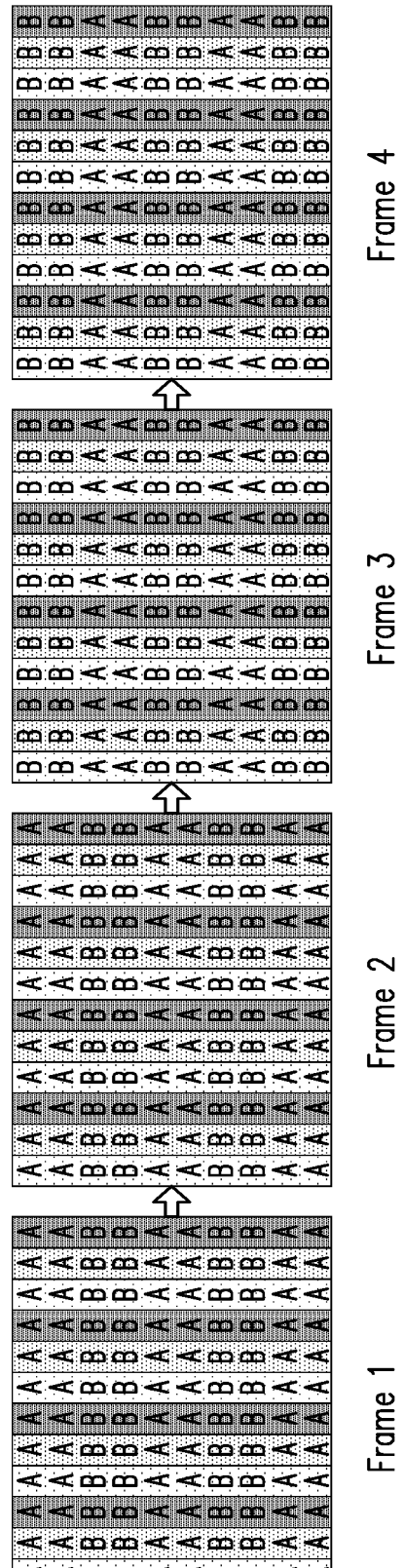
Figure 12C:
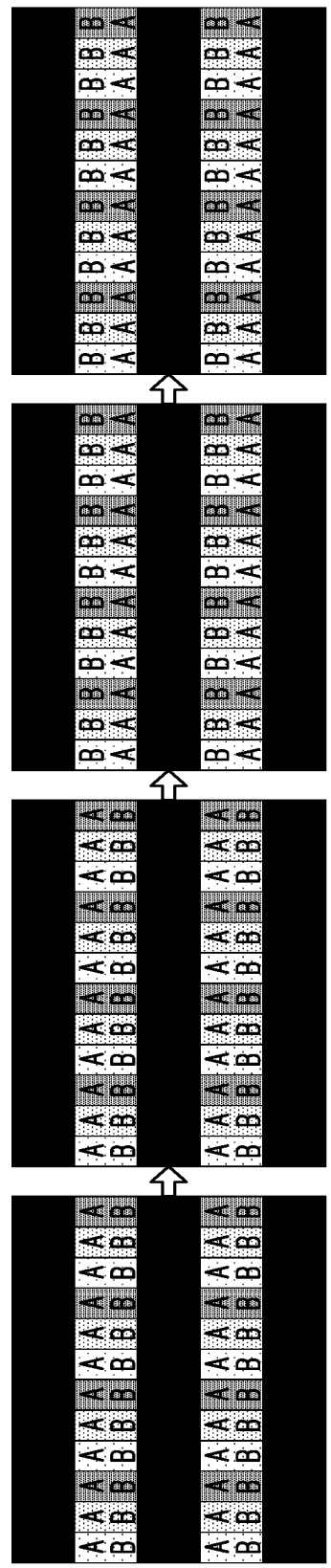

FIGS. 12A-12C illustrate another example how to avoid the image pattern displayed on the display panel flickering by automatically selecting appropriate chopper algorithm while testing the display panel according to embodiments of the disclosure. The display units on the display panel are driven by using the chopper mode "2-line, 2-frame" (shown in FIG. 12A) and the flickering of the present image on the display panel occurs. FIG. 12A shows four frames Frame 1 to Frame 4 with the first two frames similar combination and other two consecutive frames with opposite patterns. That is, two horizontal lines in each frame is with pattern A and next two horizontal lines, so that the order "AABBAABB . . . " in each column of the frames are formed, and the other two frames contrary with the first two frames as shown in FIG. 12A.

While the display panel is tested by the image pattern with the H-stripe format, two-row of the display units may be disabled and the next two-row of the display units are used to display the image pattern shown in FIG. 12B. The display panel displays image pattern with the H-stripe format, due to the offset difference in the gamma operational amplifier input stage, the pixel units in the Frame 1 and Frame 2 only have one pattern (i.e., pattern B) of the polarities of the input stage differential pair in the gamma operational amplifier, and pixel units in the Frame 3 and Frame 4 only have another pattern (i.e., pattern A) of the polarities of the input stage differential pair in the gamma operational amplifier. That is, image pattern with the H-stripe format results in two frames display only pattern B and other two frames display only the pattern A. If patterns A and B are imbalanced in each frame, that frames appear at flashing rate 1/2 (i.e., 60 Hz) of the 120 Hz to cause present image flickering.

After changing the driven chopper mode from the chopper mode "2-line, 2-frame" to the chopper mode "1-line, 2-frame", the image pattern displayed on the display panel is not flickering, shown in Fi. 12C. FIG. 12C illustrates a schematic view of the display panel with a chopper mode "1-line, 2-frame" when the display panel displays the image pattern with the H-stripe format. The image flickering detector detects that the present image is flickering in the chopper mode "2-line, 2-frame", them the chop selector changes from the chopper mode "2-line, 2-frame" to the chopper mode "1-line, 2-frame". As shown in FIG. 12C, the chopper selector set the chopper mode "1-line, 2-frame", so that the image pattern on the display panel can be arranged through a spatial arrangement of the pixel units to present both the pattern A and pattern B in each frame as shown in the FIG. 12C, so as to average brightness of the adjacent pixel units and to avoid the image displaying on the display panel flickering.

In summary, the control apparatus in the embodiments of the disclosure are capable of automatically selecting/changing appropriate chopper algorithm (i.e., changing one of a plurality of chopper algorithms sequentially) for effectively avoiding the image pattern displayed on the display panel flickering. In other words, the control apparatus detects whether a present image displayed on the display panel is flickering or not by the image flickering detector, and the chopper selector of the control apparatus selects or changes an appropriate chopper algorithm (i.e., chopper mode) from the plurality of chopper algorithms (i.e., chopper modes) to adjust the gamma voltages of the display image data (i.e., test image data) in response to the present image on the display panel flickering until the present image on the display panel is not flickering. Thus, the control apparatus of the display panel avoids present image on the display panel flickering because of the driven chopper algorithm of the display panel while testing the display panel.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A control apparatus for driving a display panel, comprising:
    an image flickering detector for detecting whether a present image displayed on the display panel is flickering or not; and
    a chopper mode selector, coupled to the image flickering detector, wherein the display panel includes at lease one gamma operational amplifier with an input stage differential pair,
    wherein the chopper mode selector selects a first chopper mode from a plurality of chopper modes, and the image flickering detector detects whether the present image displayed on the display panel according to a display image data is flickering or not, and
    the chopper mode selector selects a second chopper mode from the plurality of chopper modes in response to the present image flickering, wherein the first chopper mode is different from the second chopper mode,
    wherein the chopper modes are used to switch polarities of the input stage differential pair by different sequences in every fixed number of lines at one frame or different sequences in every fixed number of frames in the display image data for reduce a difference of an output voltage of the at least one gamma operational amplifier,
    the chopper mode selector comprises a buffer configured to temporarily store a selected chopper mode from the plurality of chopper modes,
    wherein the chopper mode selector stores the selected chopper mode and the selected chopper mode is used to adjust the gamma voltages of the display image data,
    wherein the at lease one gamma operational amplifier is served as an output buffer of a source driving circuit,
    wherein the control apparatus further comprising:
    a chopper control circuit, coupled to the gamma operational amplifier,
    wherein the chopper control circuit is controlled by the selected chopper mode for reducing an output voltage offset of an output node in the at least one gamma operational amplifier.

2. The control apparatus according to claim 1, wherein while the image flickering pattern detector detects that the first chopper mode makes the present image on the display panel flickering, the chopper mode selector selects the second chopper mode in response to the present image flickering, and the display panel displays the present image according to the display image data.

3. The control apparatus according to claim 1, wherein the chopper mode selector selects one of the pluralities of the chopper modes sequentially until the image flickering detector detects that the present image is not flickering.

4. The control apparatus according to claim 1, wherein the image flickering detector detects whether the present image displayed on the display panel is flickering or not in response to the present image displayed on the display panel changing.

5. The control apparatus according to claim 1, wherein the image flickering detector and the chopper mode selector are included in a timing controller.

6. The control apparatus according to claim 1, wherein the image flickering detector and the chopper mode selector are included in a source driving circuit.

7. The control apparatus for driving a display panel according to claim 1, wherein each one of the chopper modes is used to adjust gamma voltages of the display image data through a spatial arrangement of pixels.

8. A method for driving a display panel comprising:
selecting, by a chopper mode selector, a first chopper mode from a plurality of chopper modes, wherein the display panel includes at lease one gamma operational amplifier with an input stage differential pair;
detecting, by an image flickering detector, whether a present image on the display panel is flickering or not; and,
selecting, by the chopper mode selector, a second chopper mode from the plurality of the chopper modes in response to the present image on the display panel flickering, wherein the first chopper mode is different from the second chopper mode,
wherein the chopper modes are used to switch polarities of the input stage differential pair by different sequences in every fixed number of lines at one frame or different sequences in every fixed number of frames in a display image data for reduce a difference of an output voltage of the at least one gamma operational amplifier,
wherein the at lease one gamma operational amplifier is served as an output buffer of a source driving circuit,
wherein the method further comprising:
storing, by a buffer which is comprised in the chopper mode selector, a selected chopper mode, wherein the buffer is configured to temporarily store the selected chopper mode from the plurality of chopper modes, and the selected chopper mode is used to adjust the gamma voltages of the display image data; and
reducing, by a chopper control circuit, an output voltage offset of an output node in the gamma operational amplifier by the selected chopper mode.

9. The method according to claim 8, further comprising:
displaying, by the display panel, the present image according to the display image data.

10. The method according to claim 8, wherein one of the pluralities of the chopper modes are selected sequentially until the present image is not flickering detected by the image flickering detector.

11. The method according to claim 8, wherein whether the present image on the display panel is flickering or not is detected in response to the present image displayed on the display panel changing.

12. The method according to claim 8, wherein each one of the chopper modes is used to adjust gamma voltages of the display image data through a spatial arrangement of pixels.

* * * * *